United States Patent
Gomez et al.

(10) Patent No.: US 6,326,911 B1
(45) Date of Patent: Dec. 4, 2001

(54) METHOD AND APPARATUS FOR DITHERING IDLE CHANNEL TONES IN DELTA-SIGMA ANALOG-TO-DIGITAL CONVERTERS

(75) Inventors: Gabriel J. Gomez; Jenn-Yu G. Lin, both of Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/186,559

(22) Filed: Nov. 5, 1998

Related U.S. Application Data

(60) Provisional application No. 60/066,652, filed on Nov. 19, 1997.

(51) Int. Cl.[7] .............................. H03M 3/00; H03M 1/20
(52) U.S. Cl. .......................................... 341/143; 341/131
(58) Field of Search ..................................... 341/131, 143, 341/144, 155, 150, 172; 375/376; 331/4

(56) References Cited

U.S. PATENT DOCUMENTS

| | | | |
|---|---|---|---|
| 5,408,233 | * 4/1995 | Gannon et al. | 341/131 |
| 5,424,739 | * 6/1995 | Norsworthy et al. | 341/143 |
| 5,745,061 | * 4/1998 | Norsworthy et al. | 341/131 |
| 5,818,376 | * 10/1998 | Bianchessi et al. | 341/143 |
| 5,889,482 | * 3/1999 | Zarubinsky et al. | 341/131 |
| 5,905,453 | * 5/1999 | Kase | 341/143 |
| 5,990,815 | * 11/1999 | Linder et al. | 341/131 |
| 6,016,113 | * 1/2000 | Binder | 341/131 |

* cited by examiner

*Primary Examiner*—Patrick Wamsley
(74) *Attorney, Agent, or Firm*—Alan K. Stewart; Wade James Brady, III; Frederick J. Telecky, Jr.

(57) ABSTRACT

A method and apparatus for dithering idle channel tones in delta-sigma converters is provided. In a delta-sigma modulator (10), random dither signal (23) is added before quantizing a signal in order to attenuate the idle channel tones. A random number generator (50) coupled to a digital-to-analog converter (52) with an applied biasing current (54) produces the dither signal (23). The dither signal (23) combines with an input signal at the input of a quantizer (14) in order to randomly change the quantizer output (15) and attenuate idle channel tones.

8 Claims, 1 Drawing Sheet

METHOD AND APPARATUS FOR DITHERING IDLE CHANNEL TONES IN DELTA-SIGMA ANALOG-TO-DIGITAL CONVERTERS

This application claims priority under 35 USC §119 (e) (1) of provisional application No. 60/066,652, filed Nov. 19, 1997.

TECHNICAL FIELD OF THE INVENTION

This invention relates to the field of analog-to-digital converters and more specifically to a method and apparatus for dithering idle channel tones in delta-sigma analog-to-digital converters.

BACKGROUND OF THE INVENTION

For many applications, it is necessary to convert a continuous analog signal into a digital signal so that the digital signal can be processed in the digital domain. One area of particular importance for this treatment is in the area of digital signal processing.

An analog-to-digital converter is a device which converts a continuous range of analog signals into digital signals. The major factors that determine the quality of an analog-to-digital converter are resolution, sampling rate, and speed.

Resolution in an analog-to-digital converter is the smallest change in voltage that an analog-to-digital converter can detect and that can produce a change in the digital signal. The resolution determines the total number of digital codes or quantization levels that the converter can produce.

Resolution of an analog-to-digital converter is usually specified in terms of bits of the digital code. An m bit code allows for $2^m$ quantization levels of $2^m-1$ steps between quantization levels. Thus, a one-bit analog-to-digital converter has two quantization levels and will convert an analog signal into either a one and zero. A two bit code will convert an analog signal into a series of two bit digital code (i.e., 00, 01, 10, or 11) with a total of four quantization levels.

Analog-to-digital converters also have a maximum sampling rate that limits the speed at which they can perform conversions. The sampling rate is the number of times per second that the analog-to-digital converter can sample the analog signal. For proper preservation of information in a signal, the minimum sampling rate must be at least two times the highest frequency of the analog signal being sampled. The sampling rate of two times the highest frequency of the signal being sampled is called the Nyquist sampling rate. Nyquist converters are analog-to-digital converters that operate at the Nyquist rate. Oversampled converters are those that operate at multiples of the Nyquist frequency. Oversampled converters operate at ranges from 2 to 512, or even greater, times the Nyquist rate.

Conversion time is the time it takes an analog-to-digital converter to convert an analog signal into a digital signal.

Several different types of analog-to-digital converters exist. These include flash analog-to-digital converters, pipeline analog-to-digital converters, and successive approximation analog-to-digital converters. Another popular type is the delta-sigma analog-to-digital converter.

One drawback of delta-sigma modulators is that a slowly varying signal, a signal with a small amplitude, or a signal comprising a constant DC input may produce noise in the form of an audible tone. This noise is known as pattern noise or idle channel tones.

SUMMARY OF THE INVENTION

Accordingly, it may be appreciated that a need has arisen for a method and apparatus for dithering idle channel tones in delta-sigma analog-to-digital converters. In accordance with the present invention, a dithering method and apparatus is provided which substantially eliminates or reduces disadvantages and problems associated with current analog-to-digital converter systems.

In one embodiment of the present invention, a dither current generator is provided. The dither current generator comprises a random number generator coupled to a digital-to-analog converter. The random number generator outputs a random number to the digital-to-analog converter which outputs a dither current proportional to an applied digital input and bias current. The dither current is added to the input of a comparator, thereby randomly changing the comparator's threshold. These random changes in the comparator's threshold produce occasional changes in the comparator's output, thus breaking the regular patterns that cause idle channel tones.

The present invention provides various technical advantages over current analog-to-digital converters. For example, one technical advantage is the attenuation of idle channel tones by adding a dither current. Another technical advantage is the ability to provide a tone-free analog-to-digital converter in a compact, efficient design. Other technical advantages may be readily apparent to one skilled in the art from the following figures, descriptions and claims.

BRIEF DESCRIPTION OF THE DRAWINGS

For a more complete understanding of the present invention and for further features and advantages, reference is now made to the following description taken in conjunction with the accompanying drawings, in which like reference numbers indicate like features and wherein.

DETAILED DESCRIPTION OF THE INVENTION

Figure 1:
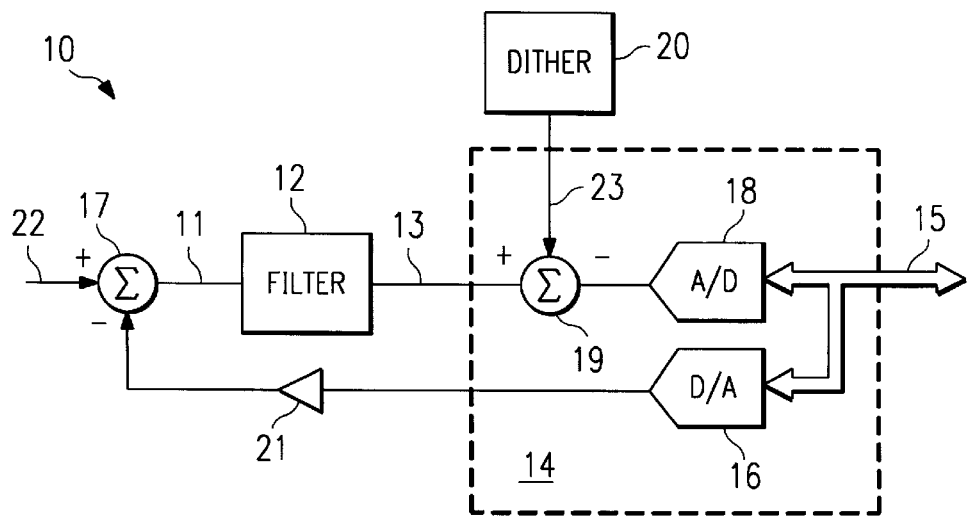
FIG. 1 illustrates the basic structure of a first-order delta-sigma analog-to-digital converter with dithering constructed in accordance with the teachings of the present invention.

The present invention provides an improvement in the operation of delta-sigma analog-to-digital converter systems. In operation, a delta-sigma analog-to-digital converter work as follows. First, a sampler samples an analog input at a very high rate. The analog input can be from any number of sources including voice or music captured by a microphone or by playback on a tape or other type of recorder. The sampler captures a small segment of the analog input at regular time intervals. In delta-sigma analog-to-digital converters, sampling is done at many times the Nyquist rate, a process known as oversampling. Typical oversampling rates for delta-sigma analog-to-digital converters are from 2 to 512 times the Nyquist rate.

Oversampling spreads quantization noise across a greater bandwidth. Quantization noise is noise that is inherent to all analog-to-digital converters and will be discussed in greater detail below. For example, if the signal if interest has a 22.05 kHz bandwidth (audio signals, for example) and the sampler samples the signal at the Nyquist frequency of twice the bandwidth (44.1 kHz), the quantization noise is spread from 0 to 22.5 kHz. By doubling the sampling rate to 88.2 kHz, the quantization noise is spread from 0 to 44.1 kHz. The power of the noise is the same but oversampling spreads the noise over a larger frequency range. Since only the signal from 0 to 22.05 kHz is of interest, a low pass filter will remove any signal above 22.05 kHz. Thus, doubling the sampling rate reduces the quantization noise in the frequency range of interest ("pass band").

After sampling, the oversampled signal passes through an analog delta-sigma modulator. A modulator comprises at least one filter and a quantizer coupled together. The oversampled signal passes through the filter where the frequency spectrum is shaped. In one embodiment, the signal may be sampled and filtered (or integrated) in a single unit. The filtered signal then passes through a quantizer which converts the filtered signal to a digital signal. The quantizer outputs the digital signal at the oversampled rate. The digital signal passes through a digital-to-analog converter and feeds back into the input of the filter along with the analog signal. This is done to force the average value of the quantizer output to follow the average value of the oversampled signal.

Due to the feedback path, it can be shown that the signal in the pass-band remains unchanged (only delayed), while the quantization noise is shaped by a high-pass-like transfer function. Thus, the quantization noise is greatly attenuated in the pass-band, and amplified out of band (the total energy remains unchanged), making a delta sigma modulator clearly superior over just oversampling. The out-of-band noise can later be removed by a digital filter.

A digital filter removes the out-of-band noise from the digital signal and a decimator reduces the digital signal back to the Nyquist rate. The final output is a digital signal at the Nyquist sampling rate. The digital signal is then ready to undergo processing or storage.

Delta-sigma modulator design falls into two different categories: single stage modulators and multistage modulators. Single stage modulators comprise at least one filter and one quantizer. Single stage modulators are further divided by the order of the filter before the quantizer. An m-order modulator is a modulator where the signal passes through an mth order filter, or through m filters before passing through a quantizer. Adding additional filters leads to higher order delta-sigma modulators.

Delta-sigma modulators are commonly used in analog-to-digital converters for several reasons. First, they are easy to manufacture because they use relatively simple analog circuits and can be fabricated in a single integrated circuit together with additional digital circuitry. Second, delta-sigma modulators can provide a very high resolution for low and medium frequency applications.

One drawback of delta-sigma modulators is that a slowly varying signal, a signal with a small amplitude, or a signal comprising a constant DC input may produce noise in the form of tones in the band of interest. This noise is known as pattern noise or idle channel tones.

Some noise occurs in all types of analog-to-digital converters and is the result of the error produced by quantizing a continuous-amplitude signal into a discrete number of allowed levels. This is called quantization noise or quantization error. Quantization noise occurs under any input signal. For a random input signal, however, the noise distributes equally across the frequency range of the input signal as discussed previously. As discussed previously, oversampling can be utilized to attenuate random quantization noise over a frequency range of interest, and delta-sigma modulators can be used to shape the frequency spectrum of this noise and attenuate its energy even more inside the band of interest.

For slowly varying signals, signals of small amplitude or signals comprising a constant DC input, the quantization noise is not random, and presents repetitive patterns which produce tones in the frequency spectrum. For example, if the input signal to a delta-sigma modulator is a DC input, the output from a one bit quantizer will oscillate between two levels with the mean value equal to the DC input. This oscillation becomes repetitive as the quantizer output feeds back to the filter. In audio applications, if the frequency of repetition lies in an audible frequency range, a listener will hear an audible tone. This is an idle channel tone.

Idle channel tones occur in all types of modulators. Several techniques have been proposed to reduce or eliminate idle channel tones. One technique is to use higher order modulators. As the order of the modulator increases, the quantization error is further randomized, breaking the repetitive patterns that produce tones. Unfortunately, as the order of the modulator increases, the difficulties and expense of fabricating such a modulator also increase and modulators become more unstable. Still, higher order modulators are not completely free from idle channel tones.

Another technique is to add a dither signal to the signal before quantization. Dithering is the addition of random noise to a signal. The random noise breaks up the idle channel tones by distributing the energy of the tones across the entire frequency spectrum. In terms of an audio application, it is the same as converting distortion into a low-level broadband hiss. Several different techniques have been suggested to introduce a random dither signal into a delta-sigma analog-to-digital converter. These methods are typically complex and require the addition of extra components, such as additional filters, or are not robust enough to dither all tones.

In the description that follows, a delta-sigma modulator is a modulator comprising at least one filter coupled to a quantizer, as discussed previously. Delta-sigma modulators are also known in the literature as sigma-delta modulators.

FIG. 1 illustrates the basic structure of a first order delta-sigma modulator 10 constructed in accordance with the teachings of the present invention. In operation an oversampled signal 11 passes through a filter 12. Oversampled signal 11 is an analog signal sampled at many times the Nyquist rate as discussed previously. Filter 12 is a filter operable to attenuate the desired frequency components of the input spectrum. The output of filter 12 is a filtered signal 13. Typically, in base-band modulators, filter 12 is implemented as an integrator. Since there is only a first-order filter 12 in modulator 10, FIG. 1 illustrates a first order delta-sigma modulator.

Next, filtered signal 13 passes to a quantizer 14. Quantizer 14 converts filtered signal 13 into an m-bit sequences of zeroes and ones. The number of bits determine the type of quantizer 14; i.e., a one bit quantizer, a two-bit quantizer, etc. From the number of bits, the following equation can determine the number of quantization levels: $2^m=K$, where m is the number of bits and K is the number of quantization levels. For a one-bit quantizer, there are two quantization levels. Thus, the quantizer will convert filtered signal 13 into either a "one" or a "zero". A two-bit quantizer will convert filtered signal 13 into one of four two-bit sequences of ones and zeroes (00, 01, 10, or 11). Since delta-sigma modulators are designed to operate with signals sampled at a very high rate, delta-sigma modulators typically employ a low bit quantizer to reduce analog circuit design complexity and improve conversion linearity.

Quantizer 14 comprises a low-bit analog-to-digital converter 18 which is operable to convert filtered signal 13 to an m-bit sequence of 0s and 1s. Quantizer 14 also comprises a digital-to-analog converter 16 operable to convert quantizer output 15 back into an analog signal for feeding back to first summation node 17.

A quantizer output 15 feeds back to first summation node 17 after passing through a loop-back gain stage 21 so that quantizer output 15 can be subtracted from an incoming input signal 22. This forces the average value of quantizer output 15 to follow the average value of input signal 22. Quantizer output 15 continues to other components (not pictured) for further processing in the digital domain such as storage or signal processing.

Filter 12 is defined by an associated transfer function, H(z). For base-band delta-sigma designs, H(z) will have a low pass response. In a particular embodiment in high-performance modulators, filter 12 may be implemented as a differential integrator.

Also included is a dither generator 20 coupled to delta-sigma modulator 10. Dither generator 20 is operable to add a random noise component, a dither signal 23, to filtered signal 13 prior to processing by quantizer 14. In the present invention, and as discussed more fully below, dither signal 23 is added as a current directly to the input of quantizer 14.

Figure 2:
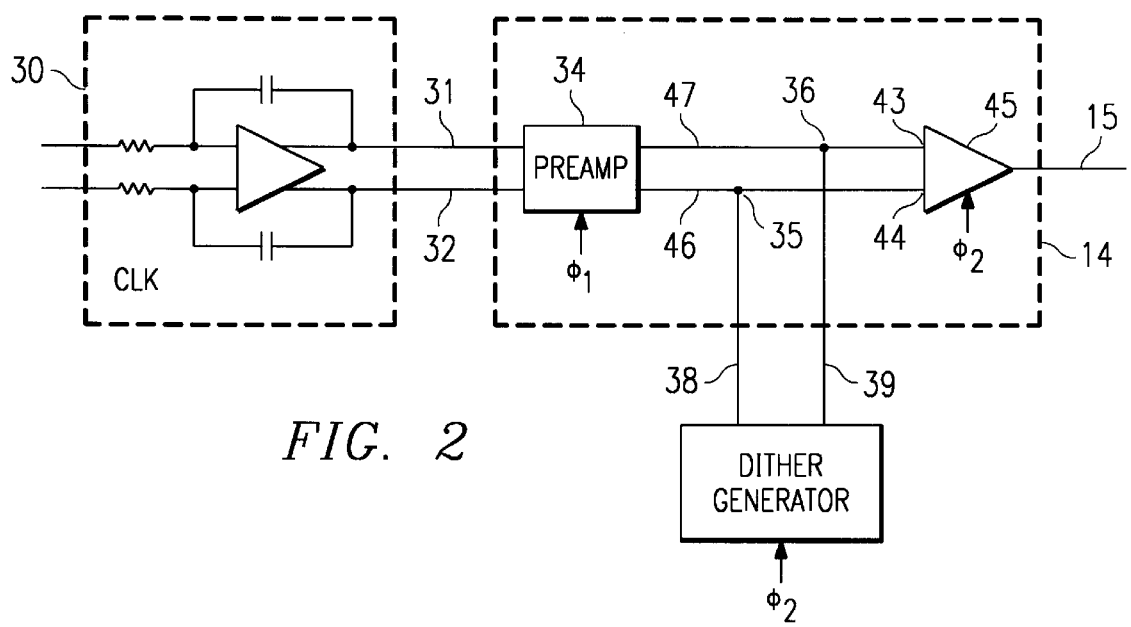
FIG. 2 illustrates the dithering implementation of dithering constructed in accordance with the teachings of the present invention; and, FIG. 3 illustrates the dither generator constructed in accordance with the teachings of the present invention.

FIG. 2 illustrates one embodiment of the dithering implementation constructed in accordance with the teachings of the present invention. FIG. 2 shows a differential integrator 30 (represented in general R-C form) which is operable to act as a low pass filter. The quantizer 14 of FIG. 1 (which was a one-bit quantizer) is represented as two components, a preamp 34 and a clocked comparator 45. Dither signal 23 (as illustrated in FIG. 1) is added at a first node 35 and a second node 36 to the output of preamp 34. Comparator 45 produces an output based on a first input 43 and a second input 44. According to one embodiment, comparator 45 is operable to compare first input 43 with second input 44 and output a sequence of logical zeros or ones based on the inputs. Comparator 45 is a clocked comparator having two phases. In a first phase, preamp 34 charges the first node 35 and the second node 36 to a set, fixed value in a differential manner. In phase two, comparator 45 compares first input 43 with second input 44. Dither signal 23 is added during the first phase. In this illustration, dither signal 23 is added as a differential dither current comprising a first dither current 38 and a second dither current 39.

In operation, differential integrator 30 outputs an integrated signal, 31 and 32, to preamp 34. Integrated signals, 31 and 32, are the differential equivalent to filtered signal 13. In this example differential integrator 30 is performing the low pass filtering. Preamp 34 amplifies integrated signals, 31 and 32, to a certain value in phase one producing amplified current signals, 46 and 47. First dither current 38 and second dither current 39 are added to amplified signals, 46 and 47, at first node 35 and second node 36, as currents, since currents can be added by simply connecting them to a common node.

This changes the values of the inputs received by comparator 45. Comparator 45 compares the value of first input 43 and second input 44 at the beginning of phase 2, by placing a differential load on the input, obtaining a differential voltage to compare. Comparator 45 outputs a logical "one" if the voltage at first input 43 is greater than the voltage at second input 44 and a logical "zero" if the voltage at second input 44 is greater than voltage at first input 43. The addition of first dither current 38 and second dither current 39 before the inputs to comparator 45 can effectively bias comparator's 45 threshold, thus inducing occasional random changes in comparator's 45 output. Therefore, dithering may induce changes in the, output of the comparator 45, but in a random fashion.

Figure 3:
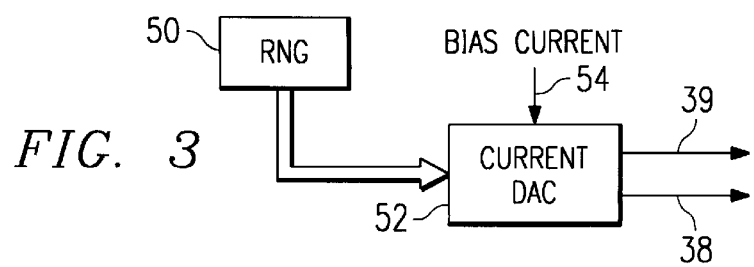

FIG. 3 illustrates one embodiment of a dither generator 20 constructed in accordance with the teachings of the present invention. Dither generator 20 comprises a random number generator 50 which produces a multibit digital number consisting of zeroes and ones. In an exemplary embodiment, random number generator 50 is a twenty-bit random number generator in which, three bits are taken as outputs, to produce one of eight digital code words (000, 001, 010, 011, 100, 101, 110, or 111). Alternatively, a higher bit random number generator could be used and any fixed number of the bits taken as output. The output of random number generator 50 feeds into a digital-to-analog converter 52. Digital-to-analog converter 52 is a current digital-to-analog converter. A current digital-to-analog converter converts a digital sequence to a current value.

The magnitude of the current outputted by digital-to-analog converter 52 is based on a bias current 54 which is applied to digital-to-analog converter 52. The magnitude of first dither current 38 and second dither current 39 as well as the difference between the two are proportional to bias current 54. Bias current 54 is chosen to be of sufficient magnitude so that when first dither current 38 and second dither current 39 are added to the outputs of preamp 34 at first node 35 and second node 36 there is a chance that the output of comparator 45 will be different than the output would be if dithering did not occur thus breaking the pattern that causes idle channel tones.

In an exemplary embodiment, bias current 54 is 20 $\mu A$. Table 1 illustrates an exemplary set of three-bit digital numbers and the differential currents outputted from digital-to-analog converter 52.

TABLE 1

| Three-bit random number | first dither current ($\mu A$) | second dither current ($\mu A$) | difference ($\mu A$) |
|---|---|---|---|
| 000 | 0 | 80 | −80 |
| 001 | 10 | 70 | −60 |
| 010 | 20 | 60 | −40 |
| 011 | 30 | 50 | −20 |
| 100 | 40 | 40 | 0 |
| 101 | 50 | 30 | 20 |
| 110 | 60 | 20 | 40 |
| 111 | 70 | 10 | 60 |

In the disclosed embodiments, the invention is discussed in an exemplary manner as a discrete time implementation using digital or switched-capacitor circuitry. However, the invention may be implemented in a continuous time form. For example, the disclosed modulator circuitry may be converted to a continuous time form using resistor-capacitor circuitry, transconductance amplifier-capacitor circuitry, or other suitable circuitry.

Additionally, while the disclosed embodiment was shown utilizing differential circuits, the invention may be implemented using single ended implementations.

While the embodiments in the present invention has been shown with regards to a first order single stage modulator, higher order or multiple stage modulators may be implemented using the teachings of the present invention.

Thus, it is apparent that there has been provided, in accordance with the present invention, a method and apparatus for dithering idle channel tones in delta-sigma analog-to-digital converters that satisfies the advantages set forth above. Although an exemplary embodiment has been described in detail, it should be understood that various changes, substitutions, and alterations may be apparent to those skilled in the art and may be made herein to the systems and methods discussed without departing from the spirit and scope of the present invention as solely defined by the appended claims.

What is claimed is:

1. A system for attenuating idle channel tones in a delta-sigma analog-to-digital converter comprising:

a delta-sigma analog-to-digital converter comprising:
- a sampler operable to receive an analog signal and process it into discrete segments, the sampler having an input and output;
- an analog delta-sigma modulator comprising:
  - at least one integrators operable, having an input and an output and operable to process the analog signal from the output of the sampler;
  - a quantizer having an input and an output and operable to quantize the output of the integrator;
- a dither current generator coupled before the input of the quantizer and comprising:
  - a random number generator operable to generate a random digital number;
  - a digital-to-analog converter coupled to the random number generator and operable to convert a random digital number into a dither current; and wherein the dither current produced by the dither current generator randomly changes the output of the quantizer such that idle channel tones are attenuated.

2. The system of claim 1, wherein the delta-sigma modulator is a multi-stage modulator and the dither current is added before one of the quantizers.

3. The system of claim 2, wherein the dither current is added before more than one of the quantizers.

4. The system of claim 1, wherein the magnitude of the dither current is proportional to a biasing current applied to the digital-to-analog converter.

5. The system of claim 4, wherein the biasing current is about 20 $\mu$A.

6. The system of claim 1, wherein the random number generator is a twenty-bit random number generator and wherein the three least significant bits are used.

7. The system of claim 1, wherein the quantizer is a clocked current comparator.

8. The system of claim 1, wherein the sampler and the integrator are a single unit.

* * * * *